(12) United States Patent
Piasecki (10) Patent No.: US 8,633,844 B2
(45) Date of Patent: Jan. 21, 2014

(54) PERFORMING DIGITAL WINDOWING IN AN ANALOG-TO-DIGITAL CONVERTER (ADC)

(75) Inventor: Douglas S. Piasecki, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 46 days.

(21) Appl. No.: 13/362,450

(22) Filed: Jan. 31, 2012

(65) Prior Publication Data

US 2013/0194121 A1 Aug. 1, 2013

(51) Int. Cl.
*H03M 1/12* (2006.01)

(52) U.S. Cl.
USPC .............................. 341/155; 341/163; 341/172

(58) Field of Classification Search
USPC .................. 341/141, 155, 161, 162, 163, 172
See application file for complete search history.

(56) References Cited

U.S. PATENT DOCUMENTS

| 3,153,142 | A | * | 10/1964 | Hellerman | 341/165 |
| 4,454,500 | A | * | 6/1984 | Kato et al. | 341/108 |
| 4,890,095 | A | * | 12/1989 | Esser et al. | 340/657 |
| 6,653,963 | B1 | * | 11/2003 | Barrenscheen et al. | 341/155 |
| 6,922,164 | B1 | | 7/2005 | Piasecki et al. | |
| 7,038,609 | B1 | * | 5/2006 | Hurrell | 341/156 |
| 7,271,758 | B2 | | 9/2007 | Piasecki et al. | |
| 7,405,689 | B2 | * | 7/2008 | Kernahan et al. | 341/156 |
| 7,498,962 | B2 | * | 3/2009 | Alfano et al. | 341/122 |
| 2010/0271250 | A1 | * | 10/2010 | Barrenscheen et al. | 341/165 |

OTHER PUBLICATIONS

Silicon Laboratories Inc., "C8051F52x/F52xA/F53x/F53xA; 8/4/2 kB ISP Flash MCU Family," 2011, 218 pages.
Wikipedia, http://en.wikipedia.org/w/index.php?oldid=447467151, "Successive approximation ADC," date unknown (considered to be prior art), 4 pages.

* cited by examiner

*Primary Examiner* — Howard Williams
(74) *Attorney, Agent, or Firm* — Trop, Pruner & Hu, P.C.

(57) ABSTRACT

In one embodiment, a data acquisition circuit includes an analog multiplexer to receive analog signals and select an analog signal for output, an ADC coupled to the multiplexer to receive the analog signal and perform a conversion of the analog signal to a N-bit digital value in at least N clock cycles, and a controller coupled to the ADC to enable the ADC to compare the analog signal to a second analog signal in a single clock cycle.

20 Claims, 7 Drawing Sheets

EXAMPLE

WIN0H = 1 0 1 0 1 0 1 0 (8 BIT)

FIG. 11

PERFORMING DIGITAL WINDOWING IN AN ANALOG-TO-DIGITAL CONVERTER (ADC)

BACKGROUND

In many different types of systems, an analog-to-digital converter (ADC) can be used to convert an incoming analog value to a digital value. Such ADCs are useful in many contexts. Specifically, an ADC can be used to monitor a real world value, namely an analog signal such as corresponding to a voltage of a given circuit, a temperature, a level of a monitored piece of process equipment or so forth, and converted to a digital value for use in a control system, as an example.

Different types of ADCs are available. To enable conversion of many different analog values, one common ADC is a successive approximation ADC. In general, this type of ADC can generate an N-bit digital value in N clock cycles. When many different input signals are to be converted to digital values, this amount of time may not be suitable for all purposes.

SUMMARY OF THE INVENTION

According to one aspect, the present invention is directed to providing comparisons between an analog signal and a digital value such as a digital window value using an analog-to-digital converter (ADC), and more particularly to an ADC that uses a charge redistribution principle and operates according to a successive approximation algorithm.

In one exemplary embodiment the ADC can include a sampling capacitor to couple a selected capacitance between a selected one of a plurality of input lines and a sampling node to store a charge corresponding to an incoming analog signal. In addition, the ADC may include a comparator to compare a residue voltage at the sampling node to a reference voltage. This residue voltage corresponds to a difference between the incoming analog signal and a voltage applied to the sampling capacitor responsive to a digital value (such as a digital window value). Based on these inputs, the comparator can generate a comparison result without completion of a successive approximation cycle. As one such example, the comparison result can be generated in a single clock cycle, rather than incurring the number of clock cycles of the successive approximation cycle (which can be at least N cycles, where N is the number of bits of the digital value).

In various embodiments, the digital value can be fed through a register such as a successive approximation (SAR) register, which in turn provides a control value to enable the coupling of the selected capacitance between the selected input signal line and the sampling node. Note that the digital value can be obtained from a digital storage that stores digital window values. The selected value can be input from the storage into the register in parallel to reduce overhead. Also with this arrangement, a comparison result between the incoming analog signal and a second incoming analog signal can be made, which can also be performed in a single clock cycle. In addition, the incoming analog signal can be converted to a digital value of N bits in less than N conversion clock cycles, e.g., using a preloaded number of bits based on comparison of the analog signal to at least one threshold of a digital window.

A still further aspect of the present invention is directed to an apparatus including a sampler circuit to couple a controllable capacitance between one of multiple input signal lines and a sampling node and to sample a first analog signal, and a comparator circuit to compare a voltage at the sampling node to a reference voltage. To this end, a digital value can be applied to the sampler circuit to enable an analog comparison of the first analog signal and the digital value in a single clock cycle. A controller can be coupled to the sampler circuit to cause the sampler circuit to sample the first analog signal and thereafter couple a second analog signal to the sampler circuit to compare the first analog signal and the second analog signal in a single clock cycle.

Yet another aspect of the present invention is directed to a method including applying a first digital value corresponding to a first threshold of a digital window to a capacitor array of an ADC to compare a first voltage resulting from the applying to an analog signal. Then after the first comparison, a second digital value corresponding to a second threshold of the digital window is applied to the capacitor array to compare a second voltage resulting from the applying to the analog signal. From these comparisons, it can be determined and reported whether the analog signal is within the data window based on at least one of the comparisons.

A still further aspect of the present invention is directed to a data acquisition circuit that includes an analog multiplexer to receive analog signals and to select an analog signal for output, an ADC coupled to the multiplexer to receive the analog signal and perform a conversion of the analog signal to a N-bit digital value in at least N clock cycles, and a controller coupled to the ADC to enable the ADC to compare the analog signal to a second analog signal in a single clock cycle. In some embodiments, this second analog signal can be obtained from the analog multiplexer. The controller can further to enable the ADC to compare the analog signal to a digital value provided to the ADC.

DETAILED DESCRIPTION

In various embodiments, a data acquisition system can be configured to receive a variety of different analog inputs and generate digital information from these inputs. In certain phases of operation, the digital information generated responsive to an analog input can be a digitization of the analog value as effected by an analog-to-digital converter (ADC). In other phases, the digital information can correspond to a digital windowing result that indicates whether the incoming analog signal is within or outside of a given window and/or is above or below a threshold value. Or still further, two incoming analog values can be compared. All of these types of digital information can be determined using a data acquisition system in accordance with an embodiment of the present invention.

In some embodiments, the acquisition system can be configured with a successive approximation (SAR) ADC. According to a conventional SAR ADC, the conversion of an N-bit digital value may consume more than N conversion clock cycles from initiation of the conversion, owing to the N decisions that are made and additional overhead. Embodiments can reduce this conversion time when a data windowing operation is desired by directly providing one or more digital values such as digital window values to the ADC. Although embodiments described herein are with regard to a SAR ADC in a data acquisition system that receives multiple analog signals and can controllably generate digital information for each of these analog inputs, persons of skill in the art understand that the scope of the present invention is not limited in this regard, and instead embodiments can apply to other types of ADCs and acquisition systems in which analog information is obtained and processed into digital information.

Figure 1:
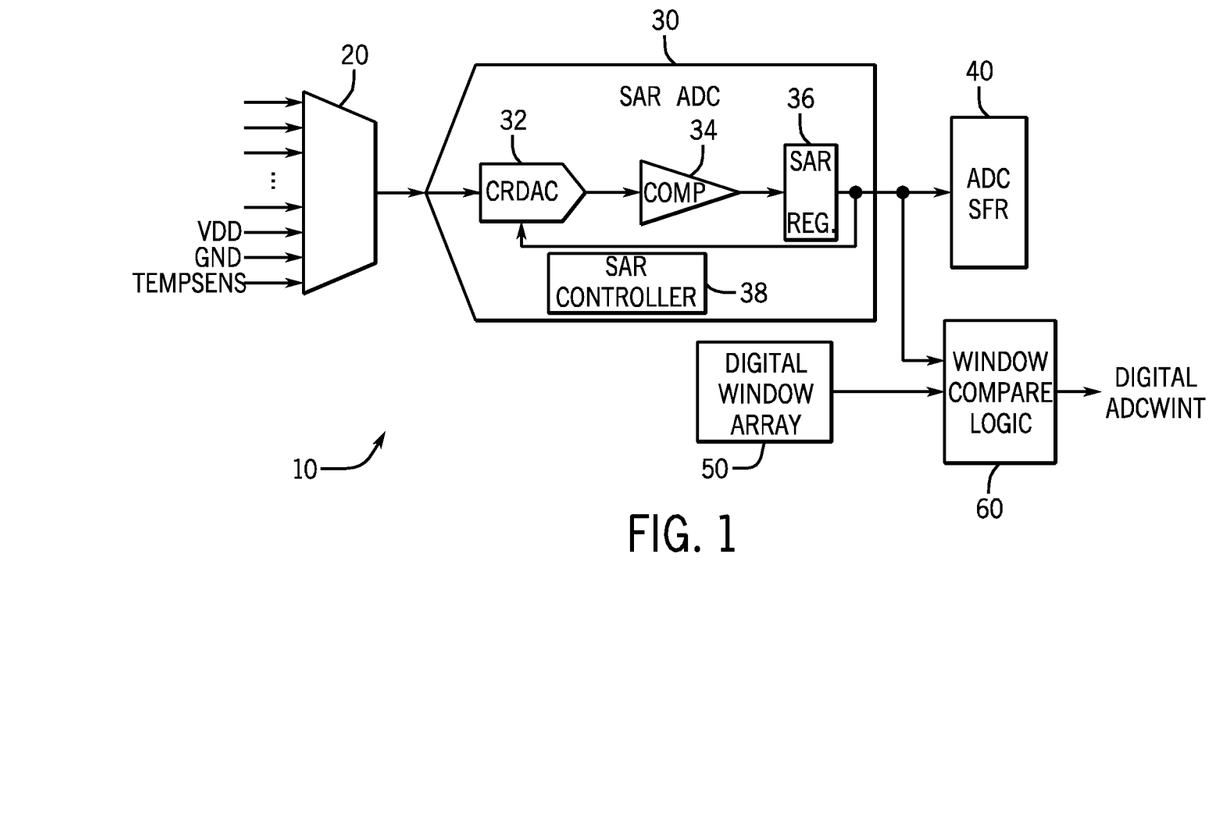
FIG. 1 is a block diagram of a data acquisition system in accordance with an embodiment of the present invention.

Referring now to FIG. 1, shown is a block diagram of a data acquisition system 10 in accordance with an embodiment of the present invention. As shown in FIG. 1, system 10 may be configured to receive many different analog inputs in an analog multiplexer 20. As an example, multiplexer 20 can be configured to receive M analog inputs and provide, e.g., sequentially, each of these analog inputs to an ADC 30. The types of analog inputs can vary. However, shown are several representative analog inputs, namely a supply voltage level (Vdd), a reference voltage level (GND), and a temperature sensor value (TempSens). Note that these analog inputs to multiplexer 20 can be from various locations of a system in which the acquisition system is included. As examples, such systems can include a microcontroller of a process control system, and the like.

When a given analog value is selected by multiplexer 20, it is provided to an ADC 30. More specifically, the analog value can be provided to a sampling circuit such as a charge redistribution digital-to-analog converter (CRDAC) 32 during a tracking or sampling phase. As will be discussed further below, the selected analog value can be stored as a charge on CRDAC 32 (which is also referred to herein as a sampling capacitor) during the tracking phase. Then during a conversion phase, a digital value is provided to CRDAC 32, namely a digital control value is used to control a capacitor array of CRDAC 32 to thus redistribute the charge to enable a comparison to be performed.

The corresponding voltage can be provided in a hold or comparison phase of operation to a comparator 34, which compares this voltage to a reference voltage (not shown for ease of illustration in FIG. 1). The resulting output, which can be a given bit of the N-bit resolution of the ADC, can be provided to an output register, namely a SAR register 36. As seen, the value stored in this register can be used to provide the control value to CRDAC 32.

When a desired result has been achieved, such as by way of generating a digitization value corresponding to N bits or a comparison to a digital windowing value (which as discussed below can be realized in a single cycle of the conversion clock), the resulting output can be provided in turn to an output register 40, e.g., a special function register, or another location, and in turn to a consumer of this information such as a microcontroller unit (MCU).

As further seen in FIG. 1, control of ADC 30 can be by way of an internal SAR controller 38. In phases in which a windowing operation is performed, the digital information output by SAR register 36 can be provided to a window compare logic 60 that can in turn make a digital comparison of this received digital information with a corresponding digital value received from a digital window storage array 50. In exemplary embodiments, this data window storage can store a plurality of threshold levels, e.g., one or more threshold or window levels for each analog input to acquisition system 10. Although shown with this particular implementation in the embodiment of FIG. 1, persons of skill in the art understand the scope of the present invention is not limited in this regard. For example, as discussed below it is possible to perform a comparison between two analog values, or between an analog value and a second value obtained using a digital value without full conversions and a subsequent digital comparison.

Figure 2:
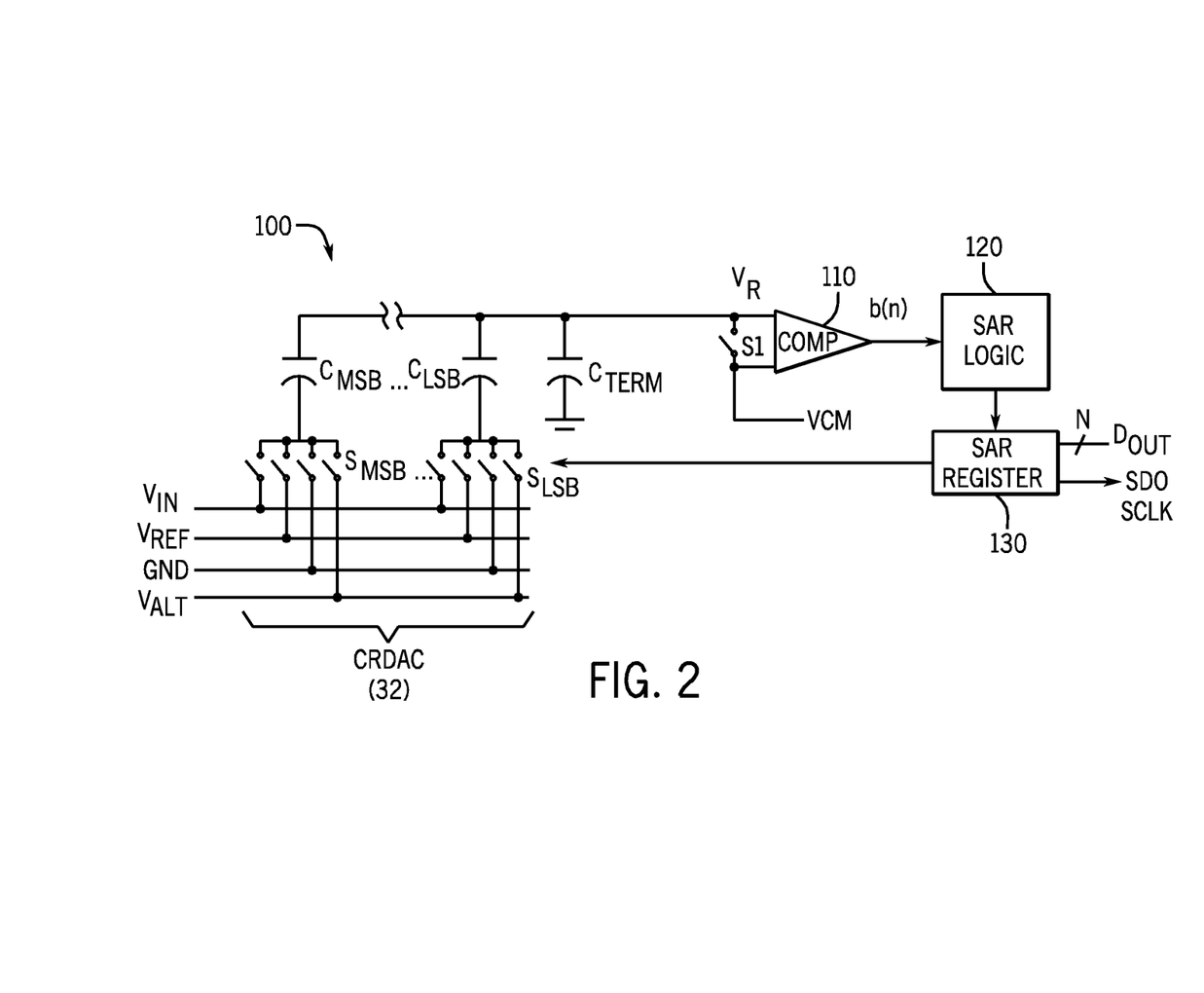
FIG. 2 is a schematic diagram of a charge redistribution DAC in accordance with an embodiment of the present invention.

To further understand the mechanism by which an input to the comparator of the ADC is obtained, reference can be made to FIG. 2, which is a schematic diagram showing further details of a charge redistribution DAC in accordance with an exemplary embodiment. As shown in FIG. 2, circuit 100 includes a CRDAC 32 which may correspond to CRDAC 32 of FIG. 1.

As seen, the CRDAC can be formed of a plurality of individual capacitors, from a least significant bit (LSB) capacitor $C_{LSB}$ to a most significant bit (MSB) capacitor $C_{MSB}$ coupled in parallel between a set of input signal lines and a sampling node $V_R$ (which is also an input node to a comparator 110). In some embodiments, an additional termination capacitor $C_{Term}$ having a value equal to the LSB capacitor can also be present. The weightings of these different capacitors can be on different bases in different implementations. For purposes of illustration assume a radix 2 or binary weighting of capacitances such that $C_{MSB}$ has a weight of ½ C and $C_{LSB}$ has a weight of ½"C. In general according to this weighting scheme, the weight of the MSB roughly equals the weight of the remaining bits. In other embodiments, the weighting can be of a radix less than 2, which can provide for overlap of the range. Accordingly, depending on the number of enabled capacitors under control of the switches, a capacitance of $Cx/C_{TOT}$ is present, where $C_{TOT}$ is the total available capacitance of the capacitor array and Cx is the selected (switched in) capacitance. In different embodiments, each capacitor can be formed of a single capacitor or multiple unit capacitors.

In different phases of operation, selected ones of the capacitors can be coupled to one of multiple signal lines. During a tracking phase, an input voltage Vin can be coupled to the selected capacitors by a corresponding switch $S_{MSB-LSB}$. This input voltage, which may be a selected analog signal from an analog multiplexer, can be stored as charge on CRDAC 32, which thus accumulates a charge corresponding to the analog signal during the tracking phase. As to a comparator 110 in this tracking phase, both of its input terminals can be coupled to a common mode voltage $V_{CM}$ via selective control of switch S1.

At the beginning of a conversion after the input voltage is sampled, a ground voltage can be coupled to the CRDAC. Then during the conversion an iterative process occurs in which a reference voltage Vref can be coupled to selected ones of the capacitors, e.g., beginning with the MSB capacitor so that a decision as to the MSB of the digitized value can be made. Depending on the decision, the reference voltage or the ground voltage is coupled to the MSB capacitor, and the process iterates with the next capacitor and so on.

Still further, embodiments provide for an additional input capability to provide for an efficient comparison of two analog voltages, namely the input voltage and a second analog voltage, either obtained from the same analog multiplexer, or an additional analog signal to be provided directly to the comparator. For this case, an additional signal input line Valt can further be selectively switched to the corresponding capacitors.

Still referring to FIG. 2, during this conversion process a residue voltage at a sampling node Vr is coupled to a first input terminal of comparator 110 (as switch S1 is opened), and a common mode voltage is coupled to a second input terminal of the comparator. Accordingly, comparator 110 generates a comparison result that is provided to a SAR logic 120. In various embodiments, SAR logic 120 can provide a result of the comparison, e.g., a one bit result, to a SAR register 130. Upon completion of a full conversion cycle, an N-bit output from SAR register 130 can be provided as output data Dout, which can be sent to appropriate location such as an input to a microcontroller unit or other logic. In the implementation of FIG. 2, a sampling clock SCLK and a serial value (SDO) of the N-bit output can also be sent. As further seen, the value in SAR register 130 can further control the switches of CRDAC 32 to thus selectively couple selected ones of the capacitors to either the reference voltage line or the ground voltage line. Thus FIG. 2 shows an embodiment in which the circuit 100 is arranged for conversion operations, which may consume greater than N cycles of a conversion clock to generate an N-bit output.

As discussed above, embodiments can further be used to provide for an enhanced digital windowing operation such that in a single conversion clock cycle, comparison between an incoming analog value and a digital window value can be performed. This digital window value can be provided directly to control CRDAC 32, or can instead be provide first to SAR register 130, e.g., from SAR logic 120 or another location. For example, in implementations such as shown in FIG. 1, digital window storage 50 can be coupled to provide a selected one of various digital threshold values to SAR register 36 (in the FIG. 1 embodiment). In the FIG. 2 embodiment these digital values can be provided to SAR register 130 which can thus control CRDAC 32 accordingly. Although shown at this high level in the embodiment of FIG. 2, persons of skill in the art understand the scope the present invention is not limited in this regard.

Figure 3A:
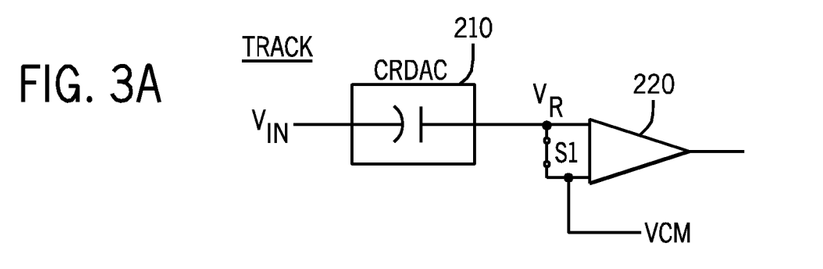
FIG. 3A is a high-level schematic of an ADC arrangement in a tracking phase in accordance with one embodiment of the present invention.

Referring now to FIG. 3A, shown is a high-level schematic of an ADC arrangement in a tracking phase. As shown in FIG. 3A, the input voltage Vin is provided to a CRDAC 210 and as seen, via switch S1 a common mode voltage is coupled both to a second input terminal of a comparator 220 and to a first input terminal of the comparator. In this tracking phase, the input voltage corresponding to a selected analog input is coupled to some or all of the capacitors of CRDAC 210. Thus during this tracking phase, a charge corresponding to the input voltage is accumulated on the selected capacitors and stored for use in later comparisons.

Figure 3B:
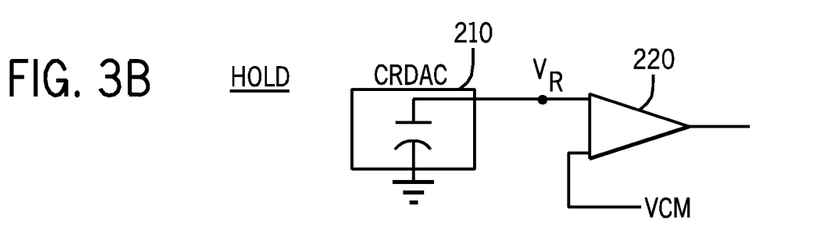
FIG. 3B is a high-level schematic of an ADC arrangement in a hold phase in accordance with one embodiment of the present invention.

In a hold phase shown in FIG. 3B, CRDAC 210 is instead coupled to a ground voltage, and switch S1 is opened (not shown explicitly) such that the common mode voltage is provided to the second input terminal of comparator 220 and the voltage at the output of CRDAC 210 is provided to the first input terminal of comparator 220. At this point, a ground voltage can be applied to the CRDAC such that after the sampling phase, a voltage of −Vin may be present at input node $V_R$ coupled to the first input terminal of comparator 220.

By using a CRDAC and a SAR algorithm, multiple comparisons can be performed by iteratively applying different digital control values to thus control an amount of capacitance of the CRDAC to which a reference voltage $V_{ref}$ is coupled. Accordingly, based on a given digital control a corresponding amount of the charge at the input node is redistributed to the selected capacitors as is known to persons of skill in the art. Accordingly, a digitization process can occur such that a residue voltage present at a sampling node coupled to an input to comparator 220 is iteratively adjusted by different reference voltages such that an output bit stream corresponding to the individual comparisons generated by comparator 220 can be obtained. Specifically, Vin can be determined according to:

$$Vin = Vref \sum^{N} b(n)/2^n$$

where b(n) is the comparator output bit stream, $V_{ref}$ is the voltage of the reference voltage input line, and N corresponds to the number of bits or resolution of the ADC. As a result, for any given single bit comparison, a change in residue voltage at the sampling node $V_R$ corresponds to:

$$\Delta V = V_{ref} C_x / C_{total}$$

where $C_x$ is the selected amount of capacitance of the CRDAC and $C_{total}$ is the total capacitance of the available capacitors of the CRDAC. In general, the generation of a conversion result thus consumes N cycles of the conversion clock as iteratively, a selected one of the N bits of the digital control value is set to a logic high or one value, beginning with the MSB.

Figure 3C:
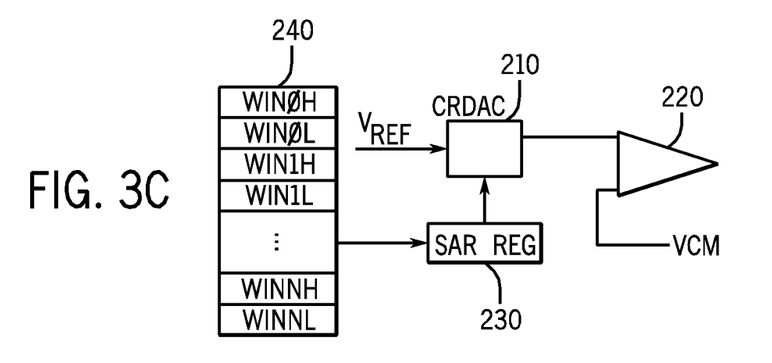
FIG. 3C is a further example of a hold phase in which a digital windowing operation in accordance with an embodiment of the present invention occurs.

FIG. 3C shows a further example of a hold phase in which a digital windowing operation in accordance with an embodiment of the present invention occurs. As seen, a selected one of multiple digital values in a storage array 240 is provided to a SAR register 230 that in turn enables control of the switches of the various capacitors of CRDAC 210 to couple selected capacitances of CRDAC 210 to Vref. Note that in the embodiment shown, pairs of entries in the storage array can correspond to high and low window (or threshold) levels for use with different analog inputs. According to this operation, a single conversion clock cycle comparison can be performed between the voltage at the sampling node and the common mode voltage. As such, a determination of whether an input voltage is greater than or less than a selected digital value can occur in a single conversion clock cycle. Although described herein as being performed in a single clock cycle, persons of skill in the art understand that the scope of the present invention is not limited in this regard, and that these comparisons can be performed in more than a single clock cycle.

Figure 4:
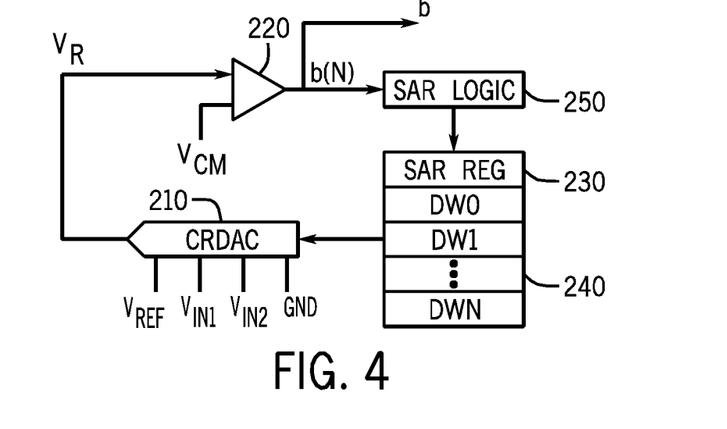
FIG. 4 is an arrangement of an ADC to perform a data windowing operation in accordance with an embodiment of the present invention.

Referring now to FIG. 4, shown is an arrangement of an ADC to perform a data windowing operation in accordance with an embodiment of the present invention. As shown in FIG. 4, CRDAC 210 is coupled to receive a digital control value from a selected one of SAR register 230 or storage array 240. Note although not shown for ease of illustration, in this implementation a multiplexer may be coupled to receive the outputs of storage array 240 and SAR register 230 and to provide a selected one of the outputs to control CRDAC 210 (e.g., based on MCU control). As seen, one of multiple input signal lines can also be coupled to CRDAC 210. As discussed above, a reference voltage line, an input voltage line, a ground voltage line and an external (or internal) alternate input voltage line all can be coupled to CRDAC, with a selective one active depending on a desired phase of operation.

The corresponding output of CRDAC 210 is provided to a first input terminal of comparator 220 and a common mode voltage is provided to the second input terminal. For this digital windowing operation, a single bit output of comparator 220 thus indicates whether the corresponding analog input voltage Vin is greater than or less than the selected comparison value, namely the output of SAR register 230 or the corresponding data window value from storage 240. This single bit value, b, can be provided to a desired location, which can be SAR logic 250 or another location such as a MCU or other consumer of this comparison decision. As seen, SAR logic 250 can further provide control to SAR register 230 and/or data window storage 240. SAR logic 250 can further provide a digital value (e.g., an N-bit value) to be inserted into SAR register 230 in a single clock cycle as a parallel input, rather than single bit inserts into this register.

Figure 5:
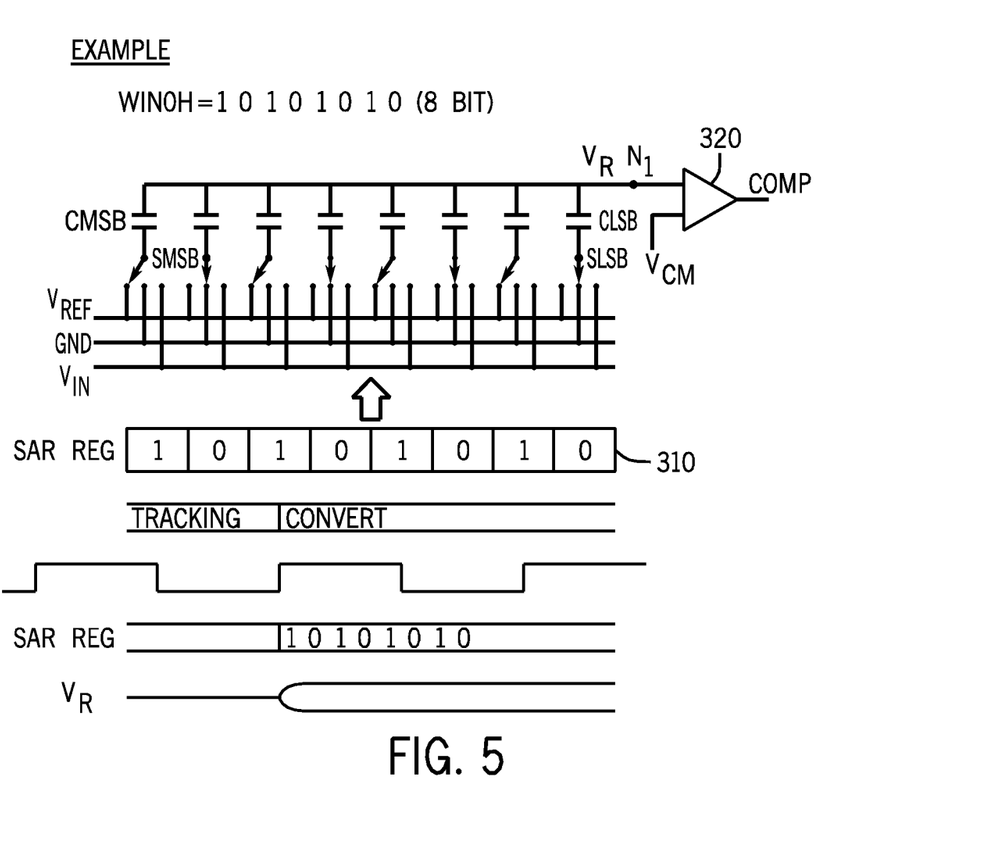
FIG. 5 is an illustration of the operation of a CRDAC in an ADC to perform digital windowing in accordance with an embodiment of the present invention.

To further understand operation in a data windowing embodiment, reference can be made to FIG. 5. As seen in FIG. 5, assume that SAR register 310 is provided with a digital window value, namely an 8 bit digital window value. For example, assume that this digital window value corresponds to an upper threshold for a first monitored value. To effect operation, the output of SAR register 310 can be provided to control logic (not shown for ease of illustration in FIG. 5) that in turn controls switches $S_{MSB}$-$S_{LSB}$ to thus couple selected corresponding capacitors to a reference voltage Vref. This coupling thus causes a redistribution of the charge stored on the sampling capacitor coupled to the first input terminal of a comparator 320 at a sampling node N1. Thus as seen in FIG. 5, in a convert phase, the SAR register value is provided to control the CRDAC and accordingly a residue voltage $V_R$ is present at the first input terminal of the comparator. The comparator may thus perform a comparison according to the following equation:

$$Vr=Vcm-Va+Vb$$

where Va is the sampled input value and Vb is the equivalent digital window value in the analog domain. Assuming Vcm equals zero, the above equation becomes:

$$Vr=Vb-Va$$

Thus, if Vr is positive, Va<Vb.

Accordingly, if Vr is positive, then Vin is less than the window threshold value and the comparison output equals 0. Otherwise, if Vr is negative, then Va>Vb, and Vin is greater than the window threshold value and the comparison output equals 1. This comparison output is thus accomplished in a single conversion clock cycle. However, persons of ordinary skill in the art understand that in other embodiments the comparison output can be of opposite polarity, and further that the comparison may consume more than one clock cycle. For example, to smooth out the signals and to ensure sufficient settling time, comparisons can be made at each of multiple clock cycles, and a count of the decisions can be maintained, e.g., in a counter. After the desired number of comparisons, a final decision can be made from these comparisons, e.g., as an average of the individual comparisons by dividing the counter value by the number of decisions.

Figure 6:
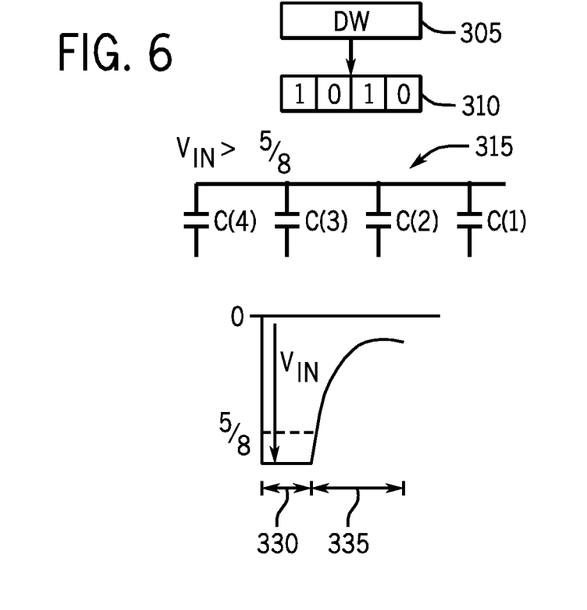
FIG. 6 is a further illustration of the operation of a CRDAC in an ADC to perform digital windowing in accordance with an embodiment of the present invention.

To further understand operation of a CRDAC of an ADC to perform digital windowing in accordance with an embodiment of the present invention, reference can be made to FIG. 6. As seen in FIG. 6, a digital window value stored in a digital window storage 305, which may be an entry of a non-volatile storage or another storage that stores various window or threshold values, can be provided to a SAR register 310. In the embodiment shown in FIG. 6, assume that SAR register 310 is a four-bit register and accordingly, a corresponding CRDAC 315 may similarly have four individually controllable capacitors that form a capacitor array (note an additional termination capacitor is not shown in this illustration). Based on the value obtained from SAR register 310, switches or other control mechanisms (not shown for ease of illustration in the embodiment of FIG. 6) can selectively couple corresponding ones of capacitors C1-C4, e.g., to a reference voltage. Thus the total capacitance available in CRDAC 315 is:

$$C_{TOT} = \sum_{}^{N} C(n)$$

Thus the total capacitance corresponds to the sum of the values of the individual capacitors. Based on the control value obtained from SAR register 310, a ratio of enabled capacitance to the total capacitance can be obtained and, when the reference voltage is applied, a comparison thus can be made between an input analog voltage (a charge of which is stored on the CRDAC) and this reference value. Specifically, a change in voltage at an input node to a comparator (which is also the output node of the CRDAC) for a digital window value of 1010 corresponds to:

$$\Delta V=Vr(C2+C4)/C_{TOT}$$

where C2 and C4 correspond to the capacitances of the enabled capacitors C2 and C4.

Thus as further illustrated in FIG. 6, a sampling node has a voltage that varies depending on the control of the CRDAC. Specifically, during a sampling phase 330, an input voltage corresponding to the analog input signal is stored on the CRDAC (corresponding to the residue voltage Vr). Then during a comparison phase 335, which can be implemented in a single conversion clock cycle, the charge can be redistributed by enabling of the corresponding capacitors such that the voltage at the input node to the comparator changes. As seen, for the given digital code 1010, this corresponds to a value of ⅝. Accordingly, a comparator (not shown for ease of illustration in FIG. 6) can determine during comparison phase 335 whether the voltage at this input terminal is greater than the common mode voltage at the other input terminal to the comparator. As seen in the graphical illustration of FIG. 6, by coupling the selected capacitors to the reference voltage, the residue voltage rises but does not exceed the common mode voltage value. And accordingly, the comparison thus indicates that the input voltage is greater than the digital window value (as the residue voltage coupled to the first input terminal is less than the common mode voltage of zero). This comparison can be performed in less than a full successive approximation cycle (e.g., N conversion clock cycles) in which a conventional SAR algorithm generates an N-bit comparison.

Figure 7:
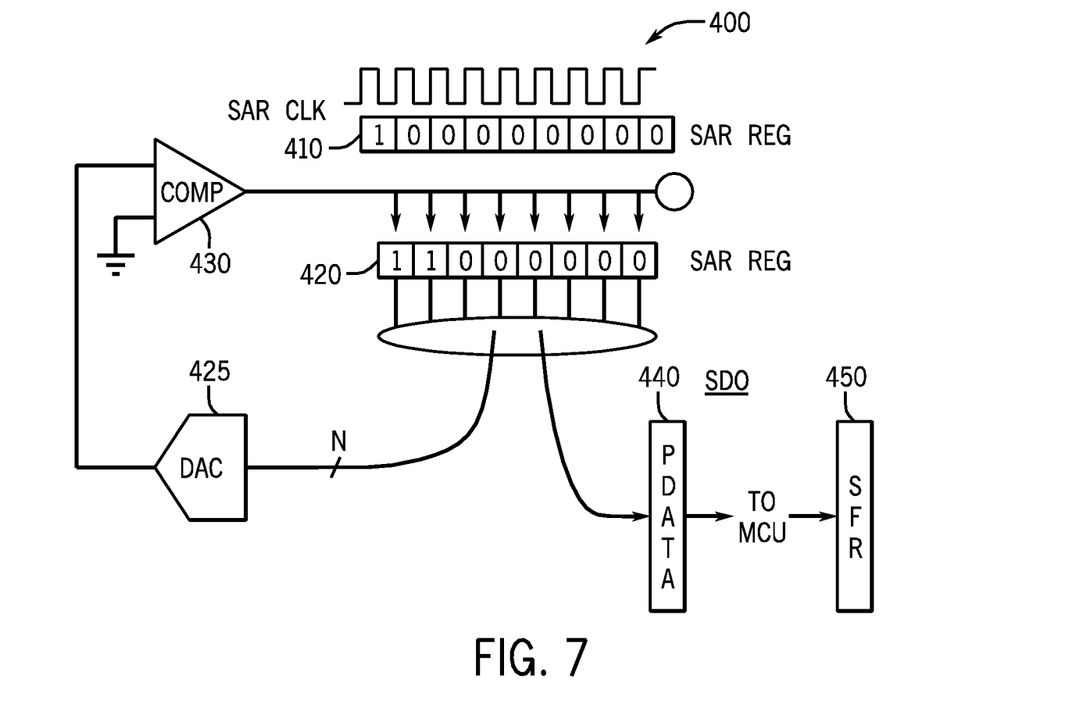
FIG. 7 is a block diagram of a circuit in accordance with an embodiment of the present invention.

Referring now to FIG. 7, shown is a block diagram of a circuit in accordance with an embodiment of the present invention. Specifically, circuit 400 of FIG. 7 shows how values can be inserted into a SAR register 420. Namely, during a comparison phase, a SAR sequencer 410 acts to provide a "walking one" function such that a value of 1 applied to the MSB of sequencer 410 sequentially passes through the bits of sequencer 410 on each cycle of the conversion clock (also referred to as a SAR clock). When a corresponding bit is high, this value is in turn written into the corresponding bit of SAR register 420.

During a comparison, which occurs on each clock cycle, the given value in SAR register 420 is thus applied to a DAC 425, which in turn causes a change in voltage at a first input terminal to comparator 430. If the result of the comparison is a logic 1, meaning that the value of the first input terminal is less than the common mode voltage coupled to a second input terminal to the comparator, the corresponding bit of SAR register 420 remains set, otherwise it is reset. Although not shown, this control can be by way of SAR logic (not shown for ease of illustration in the embodiment of FIG. 7).

Upon completion of a full conversion cycle, the value stored in SAR register 420 corresponding to the conversion value is provided to a parallel data register 440, the value of which can be communicated to, e.g., an MCU, and more particularly to a special function register 450 where the value can be stored until it is used in the MCU.

A digital window value can be provided to various locations within circuit 400. For example, the value can be provided directly to DAC 425, e.g., from a storage in which the value is located. Or the value can be loaded into SAR register 420 for insertion into DAC 425. In some embodiments, this loading of the digital window value into SAR register 420 may be preferred, as the circuitry of DAC 425 is already arranged to receive the SAR register output for controlling the CRDAC. This arrangement thus modifies a SAR register from a serial-in-parallel-out (SIPO) function to a parallel-in-parallel-out (PIPO) function.

Figure 8:
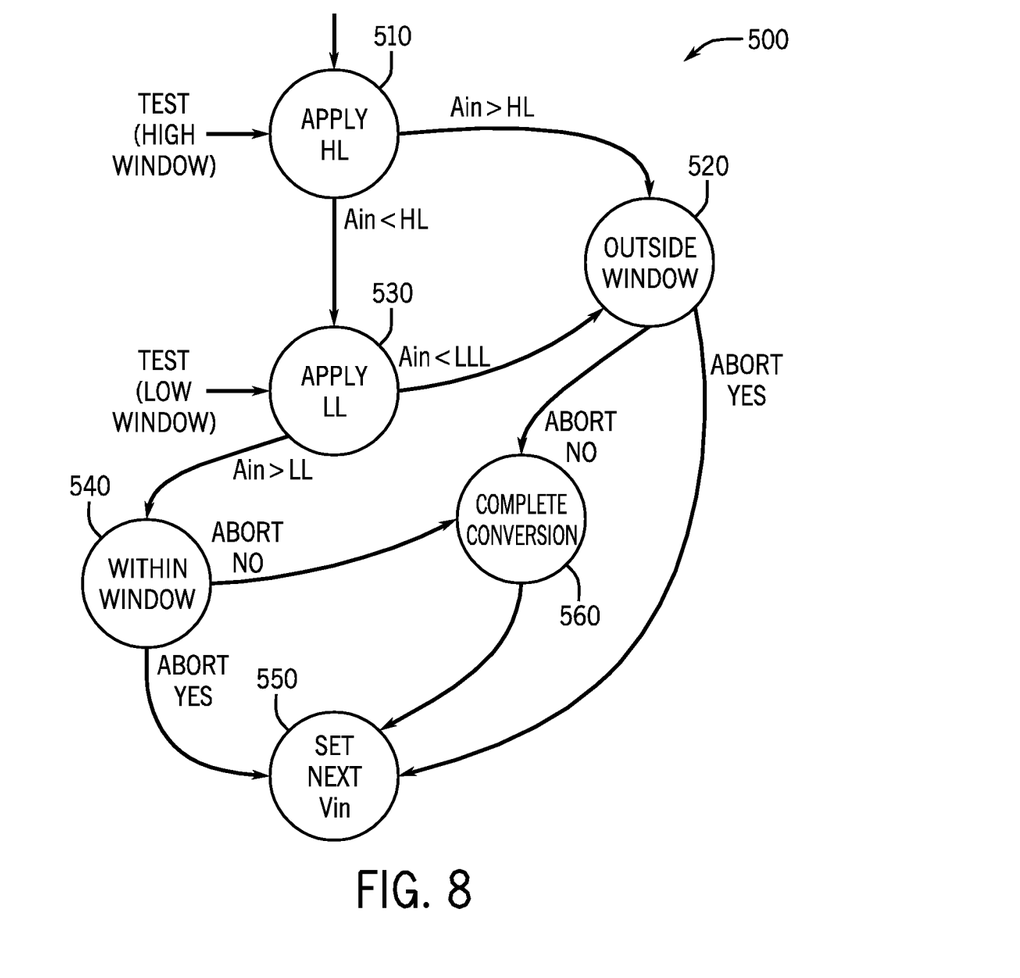
FIG. 8 is a state diagram for a state machine in accordance with an embodiment of the present invention.

Referring now to FIG. 8, shown is a state diagram for a state machine in accordance with an embodiment of the present invention. As seen in FIG. 8, state machine 500 may be implemented in hardware, software and/or firmware of a system that can perform digital windowing in accordance with an embodiment of the present invention. As shown in FIG. 8, state machine 500 may begin by entering into a state 510 in which a high level can be applied for a comparison with an incoming analog input. If the analog input is greater than this high level threshold, control passes to state 520 where a decision can be reported that the analog value is thus outside the digital window of comparison. As seen, a selected one of two paths may be taken. First, the digital windowing operation can be aborted if the only decision sought is whether the analog value is within or outside the digital window. Thus if this decision is sought, control passes to state 550 where the ADC can be reset for testing of a different analog value.

Otherwise if a conversion operation is desired, control passes to state 560 where a conversion can be completed. In one embodiment, this conversion can be in accordance with a conventional SAR algorithm. Or, as will be described below in other embodiments a given number of MSBs of the SAR register that controls a CRDAC of the ADC can be set in accordance with the determination that the analog value is outside the window. In this way, the complete conversion can be performed more rapidly, as at least some number of bits of the SAR register can be preset.

Still referring to FIG. 8, if instead at state 510 it is determined that the input analog value is less than the high level, control passes to state 530 where a lower level of the digital window can be applied. And thus it can be determined whether the analog value is greater than or less than this lower level. If it is greater than this lower level, the analog input value is thus within the data window, which can be reported at state 540. As with the operations discussed at state 520, at this point either further operations with regard to this analog value can be aborted with control passing to state 550 or a complete conversion can be performed as discussed above at state 560. Note that in another implementation, after determining that the analog value is within the window, one or more additional comparisons can be performed with regard to other threshold values (e.g., a midpoint or tolerance value) to more accurately determine where within a window the analog value is.

Figure 9:
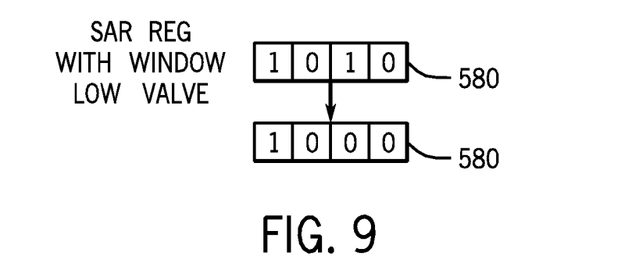
FIG. 9 is an illustration of a comparison operation in accordance with one embodiment of the present invention.

As described above, it is possible to perform a full conversion operation more rapidly after a determination of whether the analog input value is within or outside of a given window. Assume as just discussed that it is determined that the analog input value is within the data window, a full conversion can be more rapidly performed by preloading the SAR register with information regarding this digital window determination. Specifically, as shown in FIG. 9, using the present value stored in the SAR register 580, e.g., corresponding to the lower level, to complete a full conversion, SAR logic may control the value in the SAR register to back up to the first (with reference to the MSB) low value (e.g., a logic 0) in the SAR register and begin a full conversion process from this value. Thus as seen in FIG. 9, assume that SAR register 580 includes a value of 1010 as a low level threshold. To complete the conversion, the SAR logic may preload the MSBs with the window value until the first logic 0 value is reached, namely 1011 is input into the SAR register, and load the remaining bits with a logic 0 value and begin the full conversion by incrementing first the LSB to a logic 1 value.

Referring back to FIG. 8, if instead it is determined at state 530 that the incoming analog value is less than the lower level, control passes to state 520 discussed above. Thus this determination that the analog value is outside the digital window can be reported. Accordingly, in the embodiment shown in FIG. 8, a determination of presence of an analog value within or outside of a data window can occur efficiently, e.g., within one or two conversion clock cycles. Although shown with this particular implementation in the embodiment of FIG. 8, persons of skill in the art understand the scope of the present invention is not limited in this regard.

As discussed above, in some implementations it is possible to compare multiple analog voltages in a single sampling cycle. In one implementation, this mechanism can be implemented by providing an auxiliary voltage line, as shown above in FIG. 2. However, the scope of the present invention is not limited in this manner and persons of skill in the art understand that the multiple analog input voltages can come from a same input signal line, e.g., at an output of an analog multiplexer.

Figure 10:
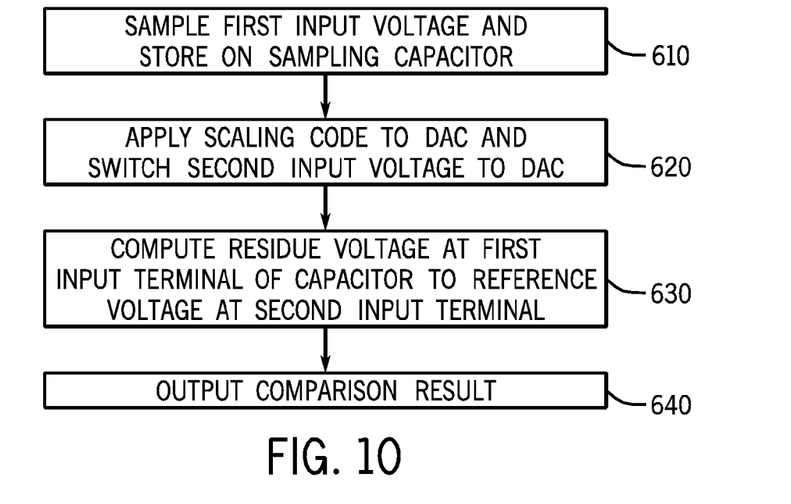
FIG. 10 is a flow diagram of a method for comparing analog voltages in accordance with an embodiment of the present invention.

Referring now to FIG. 10, shown is a flow diagram of a method for comparing analog voltages in accordance with an embodiment of the present invention. As shown in FIG. 10, method 600 can be implemented in a circuit such as shown in FIG. 2 to enable comparison of a first analog voltage, e.g., obtained on a first input signal line from an analog multiplexer output, to a second analog voltage, e.g., obtained from the analog multiplexer or an auxiliary voltage line. As seen in FIG. 10, method 600 can begin by sampling a first input voltage and storing a charge corresponding to this voltage on a sampling capacitor (block 610). That is, as discussed above during a sampling phase, an input signal can be coupled to a CRDAC to thus store a charge corresponding to the voltage at a sampling node at the input of a comparator.

Next, at block 620 a scaling code can be applied to the CRDAC. In addition, a second input voltage, e.g., from an auxiliary signal line, can be switched to the CRDAC. As an example, the scaling code can correspond to a desired portion of the second analog value to be used for the comparison. For example, assume that a MCU seeks to obtain a comparison between the first analog voltage and half the value of the second analog voltage. In this example, a digital code of 1000 (assuming a 4-bit CRDAC) can be provided to thus control the capacitance of the CRDAC accordingly. In this way, a charge redistribution occurs on the sampling capacitor to the CRDAC. However, understand that in some instances this scaling code may not be present, and the CRDAC can be configured as it was for the sampling phase.

At block 630, a residue voltage at the first input terminal of the comparator can be compared to a reference voltage at a second input terminal of the comparator. As discussed above, in some embodiments this reference voltage can be a common mode voltage (e.g., 0V) such that if the charge redistribution causes a voltage at the first input node to become greater than zero (which occurs, assuming the first input voltage is a positive voltage, when the scaled second input voltage is greater than the first input voltage), the comparison result is a positive output, e.g., a logic high. Accordingly, this comparison result can be output, e.g., to a MCU or other consumer of the information. Although shown with this particular implementation in the embodiment of FIG. 10, persons of skill in the art understand that the scope of the present invention is not limited in this regard.

Figure 11:
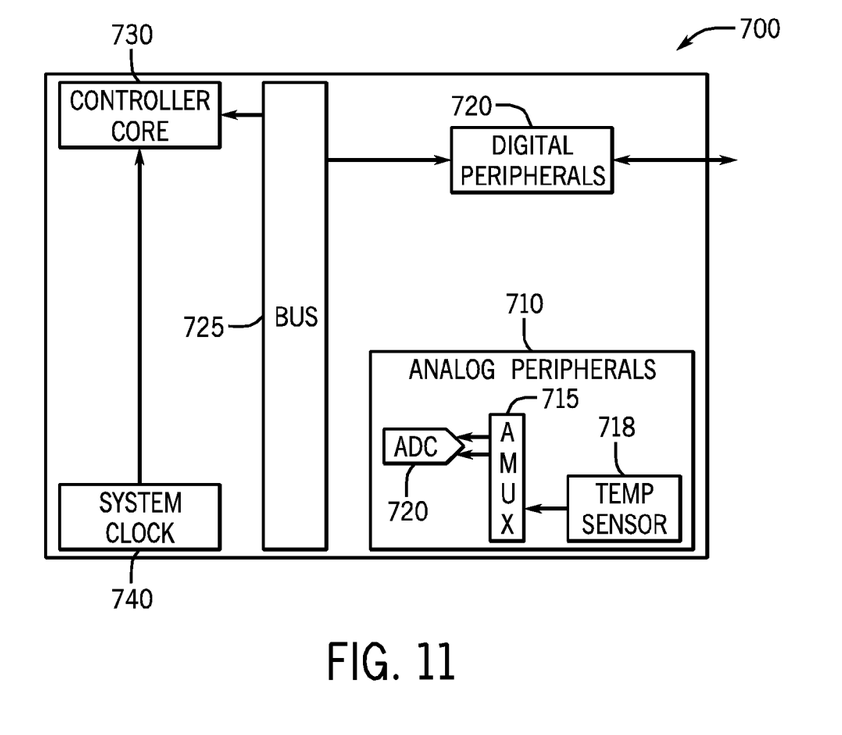
FIG. 11 is a block diagram of a system in accordance with an embodiment of the present invention.

As discussed above, an ADC in accordance with an embodiment of the present invention can be used in various systems. Referring now to FIG. 11, shown is a block diagram of a system in accordance with one embodiment of the present invention. As shown in FIG. 11, system 700 may be an MCU that includes an analog peripherals section 710 and a digital peripherals section 720. As seen, analog peripherals 710 can include an ADC 720 configured to perform comparisons of two analog signals in a single conversion clock cycle, as well as to perform single clock cycle comparisons between an analog value and a digital window value, in addition to typical conversion operations such as in accordance with a SAR algorithm. As seen, various analog signals can be input to an analog multiplexer 715, along with various reference signals, and a temperature output from a thermal sensor 718. In turn, corresponding analog signals can be provided to ADC 720 to perform various operations. Note that in the embodiment shown in FIG. 11, ADC 720 may include internal logic to form conversions and comparisons as discussed herein.

As further seen in FIG. 11, digital peripherals section 720 and analog peripherals section 710 can be coupled via a bus 725 to a controller core 730, which can perform various processing, e.g., in part based on information obtained from ADC 720 regarding various real-world signals provided to the MCU. As further seen, a system clock 740 may further be provided in coupled to controller core 730 and bus 725. Although shown at this high level in the embodiment of FIG. 11, persons of skill in the art understand the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a sampling capacitor controllable to couple a selected capacitance between a selected one of a plurality of input lines and a sampling node to store a charge corresponding to an input analog signal;
a comparator to compare a residue voltage at the sampling node to a reference voltage, the residue voltage corresponding to a difference between the input analog signal and a voltage applied to the sampling capacitor which is responsive to a digital value and to generate a comparison result without completion of a successive approximation cycle; and
a controller to control the sampling capacitor, wherein the controller is to cause the input analog signal to be stored on the sampling capacitor, and thereafter couple a second input analog signal to the sampling capacitor to enable generation of a comparison result between the input analog signal and the second input analog signal.

2. The apparatus of claim 1, further comprising a multiplexer to receive a plurality of input analog signals from a corresponding plurality of monitored locations and to provide a signal in the plurality of input analog signals as the input analog signal.

3. The apparatus of claim 2, wherein the sampling capacitor is coupled to the plurality of input lines including a first input signal line coupled to receive the multiplexer output, a reference voltage line, a ground voltage line, and an auxiliary input signal line to receive at least one other input signal.

4. The apparatus of claim 1, wherein the controller is to control the sampling capacitor to perform a conversion operation on the input analog signal during a successive approximation cycle according to a successive approximation algorithm.

5. The apparatus of claim 1, further comprising:
a register to provide a control value to enable the coupling of the selected capacitance between the selected input signal line and the sampling node; and
a digital storage device to store a plurality of digital window values, wherein the controller is to cause a selected digital window value to be written into the register.

6. The apparatus of claim 1, wherein the controller is to enable a comparison between the input analog signal and a scaled second input analog signal.

7. The apparatus of claim 1, wherein the controller is to cause a first digital value corresponding to a high threshold to control the sampling capacitor to determine whether the input analog signal is below the high threshold, and if the input analog signal is greater than the high threshold to report that the input analog signal is outside a digital window.

8. The apparatus of claim 7, wherein the controller is further to cause a second digital value corresponding to a low threshold to control the sampling capacitor to determine whether the input analog signal is above the low threshold, and if the input analog signal is less than the low threshold to report that the input analog signal is outside the digital window.

9. The apparatus of claim 1, wherein the controller is to convert the input analog signal to a digital value of N bits in less than N conversion clock cycles.

10. The apparatus of claim 9, wherein the controller is to generate the digital value of N bits using a preloaded number of bits based on at least one of a high threshold and a low threshold of a digital window.

11. The apparatus of claim 1, wherein the apparatus is to compare the incoming analog signal and the second incoming analog signal in a single sampling cycle.

12. The apparatus of claim 11, wherein the controller is to apply a scaling code to the sampling capacitor and to couple the second incoming analog signal to the sampling capacitor after storage of the charge corresponding to the incoming analog signal.

13. A method comprising:
applying a first digital value corresponding to a first threshold of a digital window to a capacitor array of an analog-to digital converter (ADC) to perform a first comparison of a first voltage resulting from the applying to an analog signal;
after the first comparison, applying a second digital value corresponding to a second threshold of the digital window to the capacitor array to compare a second voltage resulting from the applying to the analog signal; and
reporting whether the analog signal is within the data window based on at least one of the first and second comparisons.

14. The method of claim 13, further comprising responsive to determining that the analog signal is within the digital window, applying a third digital value between the first and second digital values to the capacitor array to compare a third voltage resulting from the applying to the analog signal.

15. The method of claim 14, further comprising comparing the first voltage to the analog signal in a first clock cycle, comparing the second voltage to the analog signal in a second clock cycle, and comparing the third voltage to the analog signal in a third clock cycle.

16. The method of claim 13, further comprising converting the analog signal to a digital value of N bits in less than N clock cycles.

17. The method of claim 13, further comprising a controller coupled to directly couple a second analog signal to the ADC to enable the ADC to compare the analog signal to the second analog signal in a single clock cycle.

18. A data acquisition circuit comprising:
a multiplexer to receive a plurality of analog signals and to select an analog signal as an output;
an analog-to-digital converter (ADC) coupled to the multiplexer to receive the analog signal and to perform a conversion of the analog signal to a N-bit digital value in at least N clock cycles; and
a controller coupled to the ADC to directly couple a second analog signal to the ADC to enable the ADC to compare the analog signal to the second analog signal in a single clock cycle.

19. The data acquisition circuit of claim 18, wherein the second analog signal is obtained from the multiplexer.

20. The data acquisition circuit of claim 18, wherein the controller is further to enable the ADC to compare the analog signal to a digital value provided to the ADC, and is to provide N bits of the digital value to a register in parallel, and the register is to provide the N bits to control a charge redistribution digital-to-analog converter (CRDAC) of the ADC.

* * * * *